United States Patent
Ueno

(10) Patent No.: US 11,876,450 B2
(45) Date of Patent: Jan. 16, 2024

(54) ELECTRONIC CIRCUIT FOR SUPPLYING CURRENT TO SWITCHING DEVICE AND ELECTRONIC APPARATUS

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Takeshi Ueno, Kawasaki (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 111 days.

(21) Appl. No.: 17/186,880

(22) Filed: Feb. 26, 2021

(65) Prior Publication Data

US 2021/0384827 A1 Dec. 9, 2021

(30) Foreign Application Priority Data

Jun. 3, 2020 (JP) ................................ 2020-096894

(51) Int. Cl.
*H02M 3/158* (2006.01)
*H03K 5/24* (2006.01)
*H02M 1/088* (2006.01)

(52) U.S. Cl.
CPC ........... *H02M 3/158* (2013.01); *H02M 1/088* (2013.01); *H03K 5/24* (2013.01)

(58) Field of Classification Search
None
See application file for complete search history.

(56) References Cited

U.S. PATENT DOCUMENTS

| 7,936,202 | B2 * | 5/2011 | Pham ................... H02M 1/32 327/312 |
| 9,553,510 | B2 | 1/2017 | Tsukiji et al. |
| 9,812,958 | B2 * | 11/2017 | Utsunomiya ........ H02M 3/158 |
| 10,505,438 | B2 * | 12/2019 | Sakaguchi ............. H02M 1/32 |
| 10,996,699 | B2 * | 5/2021 | Liu ....................... G05F 1/575 |
| 2021/0026385 | A1 * | 1/2021 | Park ..................... G05F 1/569 |

FOREIGN PATENT DOCUMENTS

| JP | H11-330935 A | 11/1999 |
| JP | WO 2009/044602 A1 | 4/2009 |
| JP | 2012-129971 A | 7/2012 |
| JP | WO 2012/153459 A1 | 11/2012 |
| JP | 6042091 B2 | 12/2016 |

* cited by examiner

*Primary Examiner* — Jeffrey A Gblende
(74) *Attorney, Agent, or Firm* — Oblon, McClelland, Maier & Neustadt, L.L.P.

(57) ABSTRACT

According to one embodiment, an electronic circuit includes: a first circuit configured to generate a first current and output a first voltage, the first voltage being one of a voltage based on the first current and a first predetermined voltage; a second circuit configured to generate a first output current based on the first voltage; a first output terminal outputting the first output current to a first switching device; a first input terminal having a first input signal inputted, the first input signal relating to driving and non-driving of the first switching device; and a third circuit configured to generate a first control signal based on the first input signal, the first control signal switching the first voltage to the first predetermined voltage and stopping the first current.

15 Claims, 8 Drawing Sheets

ELECTRONIC CIRCUIT FOR SUPPLYING CURRENT TO SWITCHING DEVICE AND ELECTRONIC APPARATUS

CROSS REFERENCE TO RELATED APPLICATIONS

This application is based upon and claims the benefit of priority from the prior Japanese Patent Application No. 2020-096894, filed on Jun. 3, 2020, the entire contents of which are incorporated herein by reference.

FIELD

Embodiments described herein relates to an electronic circuit and an electronic apparatus.

BACKGROUND

In electronic circuits that supply currents to semiconductor switching devices, there is known an electronic circuit that determines a current to be supplied to a semiconductor switching device using a current mirror circuit which feeds a current corresponding to a current to be referenced. In such an electronic circuit, an electronic circuit and an inverter are desired, which can reduce power consumption.

DETAILED DESCRIPTION

Figure 1:
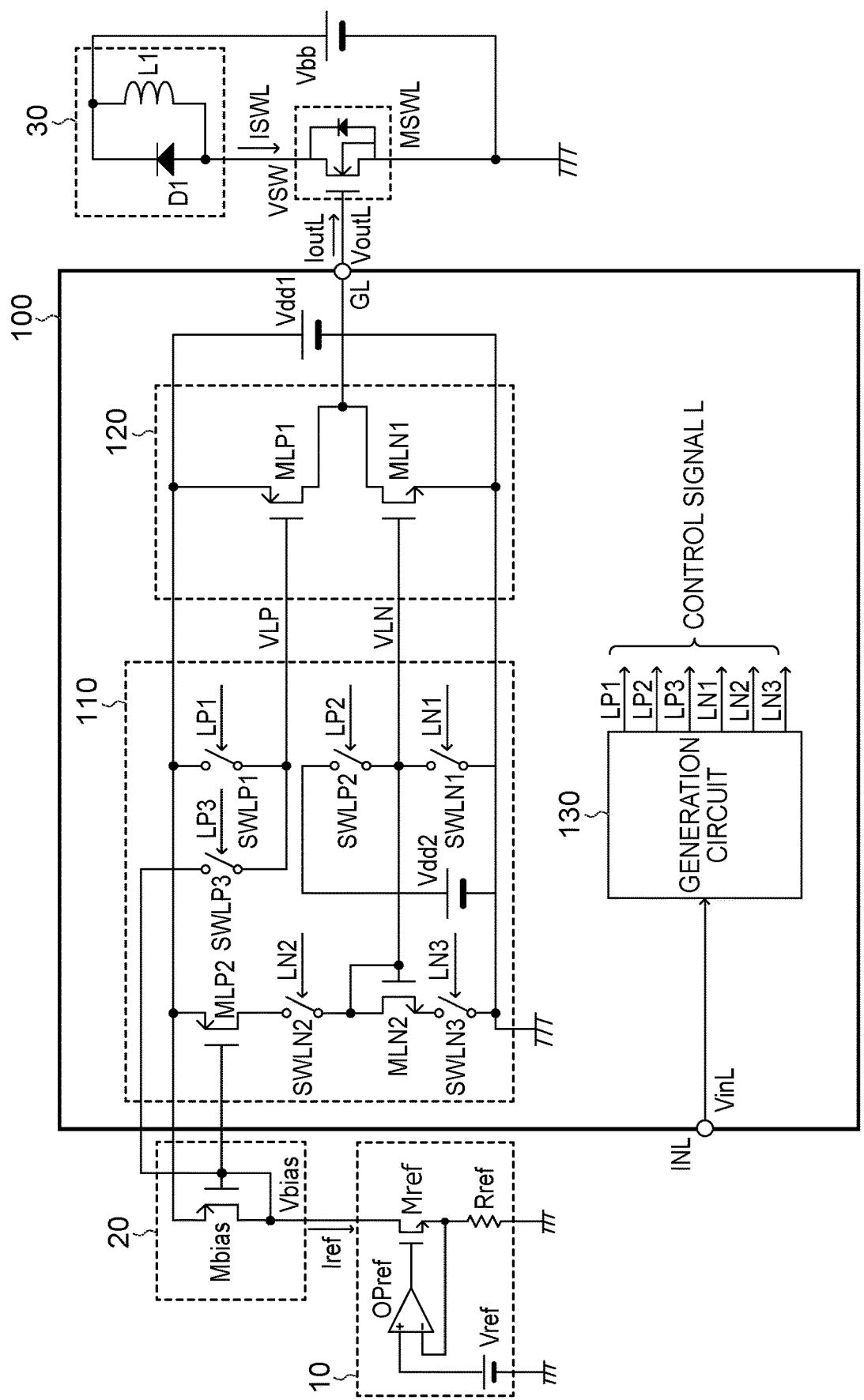
FIG. 1 is a drive system diagram including the configuration of an electronic circuit according to a first embodiment.

According to one embodiment, an electronic circuit includes: a first circuit configured to generate a first current and output a first voltage, the first voltage being one of a voltage based on the first current and a first predetermined voltage; a second circuit configured to generate a first output current based on the first voltage; a first output terminal outputting the first output current to a first switching device; a first input terminal having a first input signal inputted, the first input signal relating to driving and non-driving of the first switching device; and a third circuit configured to generate a first control signal based on the first input signal, the first control signal switching the first voltage to the first predetermined voltage and stopping the first current.

In the following, embodiments for carrying out the invention will be described with reference to the drawings. The disclosure is merely an example, and the invention is not limited by the contents described in the embodiments below. Modifications that are easily conceived by a person skilled in the art are of course included in the scope of the disclosure. In order to clarify the explanation, in the drawings, the sizes, shapes, and parameters of components may be schematically described being modified from actual embodiments. In a plurality of drawings, corresponding elements are designated with the same reference numerical characters, and the detailed description may be omitted.

First Embodiment

FIG. 1 shows a drive system according to the present embodiment. This drive system includes a switching device MSWL, a reference current source 10, a current-to-voltage conversion circuit 20 (in the following, also referred to as an I-V conversion circuit 20), a current adjustment circuit 30 that changes the feed destination of a current corresponding to turning on or off of the switching device MSWL, and an electronic circuit 100 that drives the switching device MSWL.

The switching device MSWL is a semiconductor device that switches between a drive state (ON-state) and a non-driven state (OFF-state) by a current supplied from the electronic circuit 100 (in the following, also referred to as the switching device MSWL that performs switching). The switching device MSWL typically includes a gate terminal, a drain terminal, and a source terminal, and in the drive state, the switching device MSWL carries the current from the drain terminal to the source terminal, and does not carry a current from the drain terminal to the source terminal in the non-driven state. In the present embodiment, this switching device MSWL is a high breakdown voltage power MOSFET (Metal Oxide Semiconductor Field Effect Transistor, in the following, MOSFET is referred to as a MOS transistor). It should be noted that the high breakdown voltage power MOS transistor is an example, and may be other types of devices. For example, this switching device MSWL may be an IGBT (Insulated Gate Bipolar Transistor), thyristor, or the like, or may be devices using compound semiconductors, such as SiC (silicon carbide) and GaN (gallium nitride). The switching device MSWL includes devices using semiconductors to be developed in the future.

The switching device MSWL drives a load (not shown) connected to the switching device MSWL by switching. This load is an electronic appliance or an electric appliance, and an examples of the load include a motor installed on air conditioners, refrigerators, electric trains, robots, and any other devices and a PFC (Power Factor Correction) circuit for server power supplies.

The gate terminal of the switching device MSWL is connected to the electronic circuit 100, the drain terminal of the switching device MSWL is connected to the current adjustment circuit 30, and the source terminal of the switching device MSWL is connected to a reference potential. Although the reference potential is a ground, for example, the reference potential is not limited to the ground at zero volts. Here, the gate terminal of the switching device MSWL is also referred to as a control terminal. When the switching device MSWL is a bipolar transistor, for example, this control terminal corresponds to a base terminal. It should be noted that the source terminal corresponds to an emitter terminal, and the drain terminal corresponds to a collector terminal.

The reference current source 10 is a circuit that generates a current (hereinafter, also referred to as a current Iref) which serves as a reference for the current output by the electronic circuit 100 to the switching device MSWL. The reference current source 10 includes a transistor Mref, an amplifier OPref, a voltage source Vref, and a resistor Rref. The transistor Mref is an N-type transistor in the present embodiment. The gate terminal of the transistor Mref is connected to the output terminal of the amplifier OPref, the drain terminal is connected to the I-V conversion circuit 20, and the source terminal is connected to one end of the resistor Rref, and the inverting input terminal of the amplifier OPref. Another end of the resistor Rref is connected to the reference potential. The voltage source Vref is connected to the non-inverting input terminal of the amplifier OPref. The amplifier OPref amplifies the difference between the voltage of the non-inverting input terminal and the voltage the inverting input terminal, and output the amplified difference from the output-side terminal. The voltage source Vref generates a predetermined voltage (in the following, also referred to as a voltage Vref). The reference current source 10 generates the current Iref based on the voltage Vref and the resistance value of the resistor Rref (in the following, also referred to as the resistance Rref), and supplies the current Iref to the I-V conversion circuit 20.

The I-V conversion circuit 20 converts the current Iref supplied from the reference current source 10 into a voltage Vbias, and inputs the voltage Vbias as an input voltage to the electronic circuit 100. The I-V conversion circuit 20 includes a transistor Mbias. The transistor Mbias is a P-type transistor in the present embodiment. The gate terminal of the transistor Mbias is connected to the electronic circuit 100, the source terminal is connected to a voltage source Vdd1, and the drain terminal is connected to the gate terminal. The gate terminal of the transistor Mbias is connected to the drain terminal, and thus the I-V conversion circuit 20 can convert the current Iref into a voltage (in the following, also referred to as a voltage Vbias) determined by the current Iref and the voltage across the gate and the source of the transistor Mbias.

The current adjustment circuit 30 is a circuit that changes a current feed destination corresponding to the turning on or off of the switching device MSWL. The current adjustment circuit 30 is connected to the drain terminal of the switching device MSWL and a voltage source Vbb. The current adjustment circuit 30 includes an inductor L1 and a diode D1. The inductor L1 and the diode D1 are connected in parallel. In the case in which the switching device MSWL is on, a current ISWL is carried from the current adjustment circuit 30 to the switching device MSWL. On the other hand, in the case in which the switching device MSWL is the current ISWL is carried from the inductor L1 to the diode D1 in the inside of the current adjustment circuit 30, and the current ISWL is not carried to the switching device MSWL.

The electronic circuit 100 receives an input signal VinL relating to the driving and non-driving of the switching device switches the switching device MSWL to control a current (in the following, also referred to as a current IoutL) to be supplied to the switching device MSWL, and thus switches the switching device MSWL. he electronic circuit 100 includes a voltage-to-voltage conversion circuit 110 (in the following, also referred to as the V-V conversion circuit 110), a voltage-to-current conversion circuit 120 (in the following, the V-I conversion circuit 120), a generation circuit 130, and the voltage source Vdd1. The V-V conversion circuit 110 is connected to the V-I conversion circuit 120, and the V-I conversion circuit 120 is also connected to an output terminal GL. The generation circuit 130 is connected to an input terminal INL and receives the input signal VinL. The voltage source Vdd1 generates a predetermined voltage (in the following, also referred to as a voltage Vdd1).

Figure 2:
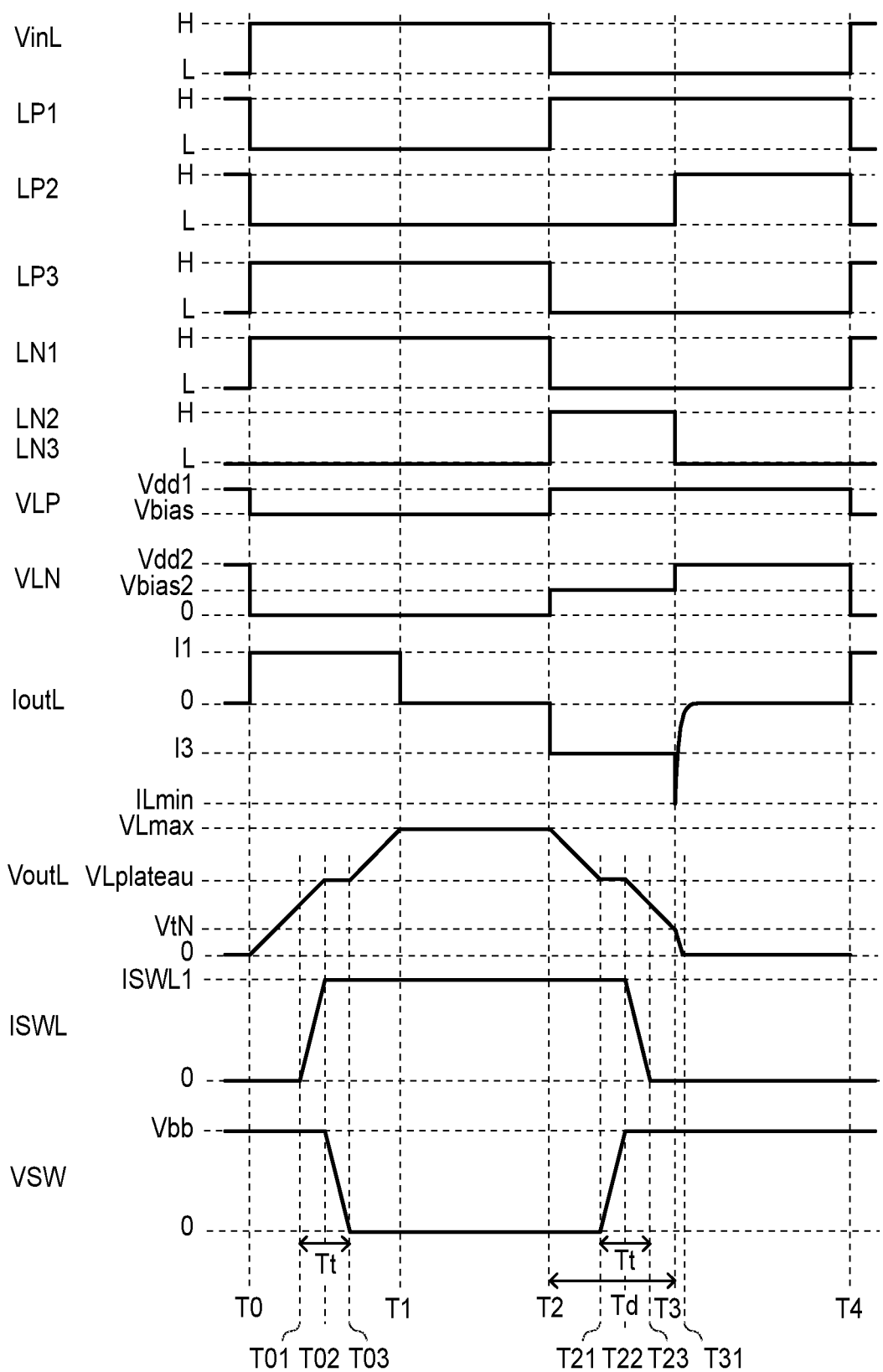
FIG. 2 is a timing chart of a drive system according to the first embodiment.

The V-V conversion circuit 110 generates voltages applied to the V-I conversion circuit 120. The voltages generated by the V-V conversion circuit 110 are also referred to as a voltage VLP and a voltage VLN. As the voltage VLP and the voltage VLN, any of voltages below is outputted, the input voltage, the voltage Vdd1 or a predetermined voltage (in the following, also referred to as a voltage Vdd2) generated by a voltage source Vdd2, and a voltage (in the following, also referred to a voltage Vbias2, and the description will be described later) based on the current carried in the V-V conversion circuit 110. In the present embodiment, as shown in FIG. 2, the voltage Vdd1 or the voltage Vbias is supplied as the voltage VLP, and any of the voltage Vdd2, the reference potential, or the voltage Vbias2 is supplied as the voltage VLN.

The V-V conversion circuit 110 includes a transistor MLP2, a transistor MLN2, a switch SWLP1, a switch SWLP2, a switch SWLP3, a switch SWLN1, a switch SWLN2, a switch SWLN3, and the voltage source Vdd2.

The transistor MLP2 is a P-type transistor in the present embodiment. The gate terminal of the transistor MLP2 is connected to the I-V conversion circuit 20, the source terminal is connected to the voltage source Vdd1, and the drain terminal is connected to the switch SWLN2. In the present embodiment, the transistor MLN2 is an N-type transistor. The gate terminal of the transistor MLN2 is connected to the switch SWLN1, the switch SWLP2, and the V-I conversion circuit 120. The drain terminal of the transistor MLN2 is connected to the switch SWLN2, and the source terminal is connected to the switch SWLN3. The gate terminal and the drain terminal of the transistor MLN2 are connected to each other.

The switch SWLP1, the switch SWLP2, the switch SWLP3, the switch SWLN1, the switch SWLN2, and the switch SWLN3 are short-circuited or opened by signals from the generation circuit 130. In the following, a state in which the switch is short-circuited/short circuit is also referred to as on, and a state in which the switch is opened is also referred to as off. The V-V conversion circuit 110 switches any of the input voltage, the voltage Vdd1 or Vdd2, and the voltage based on the current carried through in the V-V conversion circuit 110 in response to the short-circuited or opened state of the switch SWLP1 to SWLP3, SWLN1 to SWLN3, and applies the voltage as the voltage VLP and the voltage VLN to the V-I conversion circuit 120.

The switch SWLP1 is connected between the voltage source Vdd1 and the V-I conversion circuit 120. The switch SWLP2 is connected between the voltage source Vdd2 and the V-I conversion circuit 120. The switch SWLP3 is connected between the I-V conversion circuit 20 and the V-I conversion circuit 120. The switch SWLN1 is connected between the V-I conversion circuit 120 and the reference potential. The switch SWLN2 is connected between the drain terminal of the transistor MLP2 and the drain terminal of the transistor MLN2. The switch SWLN3 is connected between the source terminal of the transistor MLN2 and the reference potential.

The V-I conversion circuit 120 generates an output current IoutL to be output to the gate terminal of the switching device MSWL based on at least one of the voltages VLP and VLN applied from the V-V conversion circuit 110. This output current is supplied to the gate terminal of the switching device MSWL through the output terminal GL. In FIG.

1, the voltage at the output terminal GL is described as VoutL (in the following, also referred to as a voltage VoutL). The V-I conversion circuit 120 includes a transistor MLP1 and a transistor MLN1.

The transistor MLP1 is a P-type transistor as an example in the present embodiment. The gate terminal of the transistor MLP1 is connected to the switch SWLP1 and SWLP3. The voltage VLP generated by the V-V conversion circuit 110 is applied to the gate terminal of the transistor MLP1. The source terminal of the transistor MLP1 is connected to the voltage source Vdd1. The drain terminal of the transistor MLP1 is connected to the output terminal GL and the drain terminal of the transistor MLN1. The transistor MLN1 is an N-type transistor as an example in the present embodiment. The gate terminal of the transistor MLN1 is connected to the switches SWLN1 and SWLP2 and to the gate terminal of the transistor MLN2. The voltage VLN generated by the V-V conversion circuit 110 is applied to the gate terminal of the transistor MLN1. The source terminal of the transistor MLN1 is connected to the reference potential. The drain terminal of the transistor MLP1 is connected to the output terminal GL and the drain terminal of the transistor MLP1.

The generation circuit 130 receives the input signal VinL that is a signal relating to the driving or non-driving of the switching device MSWL from the input terminal INL. The generation circuit 130 generates a control signal L that controls short-circuiting or opening the switch SWLP1, the switch SWLP2, the switch SWLP3, the switch SWLN1, the switch SWLN2, and the switch SWLN3 based on the input signal VinL. The control signal L includes signals LP1, LP2, LP3, LN1, LN2, and LN3. The signal LP1 corresponds to the switch SWLP1, the signal LP2 corresponds to the switch SWLP2, the signal LP3 corresponds to the switch SWLP3, the signal LN1 corresponds to the switch SWLN1, the signal LN2 corresponds to the switch SWLN2, and the signal LN3 corresponds to the switch SWLN3. The generation circuit 130 transmits the signals LP1 to LP3 and the signals LN1 to LN3 to the corresponding switches. A method of transmitting the signals LP1 to LP3 and the signals LN1 to LN3 is optional, which may be a cable, or may be a wireless manner.

As described above, the configuration of the drive system of the present embodiment is described. The electronic circuit 100 may be mounted in an integrated circuit, such as an IC (Integrated Circuit) or an LSI (Large Scale Integration). The electronic circuit 100 may be collectively mounted on one chip, or a part of a circuit may be mounted on another chip. The functions of the generation circuit 130 may be implemented using a processing unit, such as a processor.

FIG. 2 is a timing chart of the drive system of the present embodiment. The operation of the drive system of the present embodiment will be described with reference to FIG. 2. In the timing chart in FIG. 2, in regard to the input signal VinL, a high signal is inputted from time T0 to time T2, and a low signal is inputted from time T2 to time T4. FIG. 2 shows the states of the components of the switching device MSWL and the electronic circuit 100 from time T0 to time T4. In FIG. 2, the high signal is described as H, and the low signal is described as L. In the case in which the electronic circuit 100 receives a high signal as the input signal VinL, the electronic circuit 100 generates an output current so as to drive the switching device MSWL. In the case in which the electronic circuit 100 receives a low signal as the input signal VinL, the electronic circuit 100 generates an output current so as not to drive the switching device MSWL. It should be noted that although the detail is described later, a time lag occurs from the reception of a high signal as the input signal VinL by the electronic circuit 100 to the actual driving of the switching device MSWL, or from the reception of a low signal as the input signal VinL by the electronic circuit 100 to the actual non-driving of the switching device MSWL. To the electronic circuit 100, the voltage Vbias based on the current Iref generated at the reference current source 10 is applied by the I-V conversion circuit 20. The transistor Mbias of this I-V conversion circuit 20 is on.

At time T0, a high signal is inputted as the input signal VinL to the electronic circuit 100. The generation circuit 130 generates low signals as the signals LP1, LP2, LN2, and LN3 and high signals as the signals LP3 and LN1, and transmits the singles to the corresponding switches. As a result, the switches SWLP1, SWLP2, SWLN2, and SWLN3 are tuned off, and the switches SWLP3 and SWLN1 are turned on. In this case, the V-V conversion circuit 110 applies the voltage Vbias as the voltage VLP to the V-I conversion circuit 120. The voltage Vbias is smaller than the voltage Vdd1. This voltage Vbias turns on the transistor MLP1. On the other hand, the voltage VLN to be applied to the V-I conversion circuit 120 becomes the reference potential, and the transistor MLN1 is turned off. At this time, no current is carried through the V-V conversion circuit 110. It should be noted that the meaning of the phrase "no current is carried" is not strictly limited to zero current, and the meaning accepts a current flow to the extent that no current is carried on circuit design.

In this case, the gate terminal of the transistor Mbias is connected to the gate terminal of the transistor MLP1 to constitute a current mirror circuit. The current mirror circuit is a circuit that feeds a current carried corresponding to a current carried across the source and drain of one of transistors across the source and drain of the other of the transistors. Since the current carried across the source and drain of the transistor Mbias is the current Iref, a current corresponding to the current Iref (in the following, this current is described as I1) is carried across the source and drain of the transistor MLP1. The current I1 is determined depending on the current Iref and the ratio of size between the transistor Mbias to the transistor MLP1. The size of the transistor is described by the ratio between the width of the transistor and the length of the gate. For example, in the case in which the size of the transistor Mbias and the size of the transistor MLP1 is 1:n (n is a number greater than zero), the current I1 is n×Iref. The current I1 is outputted as the current IoutL from the output terminal GL, and supplied to the gate terminal of the switching device MSWL. Through the current I1, electric charges are accumulated on the parasitic capacitance between the gate and source of the switching device MSWL. As electric charges are accumulated on this parasitic capacitance, the voltage VoutL at the output terminal GL rises. From time T0 to time T01, the switching device MSWL is off.

From time T0, the current I1 is kept supplied to the gate terminal of the switching device MSWL, and at time T01, a current (in the following, this current is ISWL) begins to be carried across the drain and source of the switching device MSWL. At time T02, the voltage VoutL at the output terminal GL reaches VLplateau that is a specific value. At this VLplateau, the current ISWL reaches ISWL1, and a voltage VSW at the drain terminal of the switching device MSWL begins to drop from Vbb. From time T02 to time T03, the voltage VoutL keeps VLplateau, the current ISWL keeps ISWL1, and the voltage VSW keeps dropping. It should be noted that keeping VLplateau and ISWL1 is not limited to strictly keeping the same value, and similar level may be kept. The voltage VSW is turned to zero at time T03. The switching device MSWL is on at time T03. The switching device MSWL is switching from off to on from time T01 to T03 (time Tt). Time Tt in which the switching device MSWL is switching from off to on or from on to off is referred to as transition time, time in which the switching device MSWL is transitioning, for example.

The voltage VoutL again rises from time T03, and becomes a voltage VLmax at time T1. The voltage VLmax means that electric charges are fully accumulated on the parasitic capacitance between the gate and source of the switching device MSWL. At this time, since the voltage (=Vdd1) at the source terminal of the transistor MLP1 and the voltage (=VLmax) at the drain terminal are at the same level, the transistor MLP1 is turned from on to off. Since the transistor Mbias and the transistor MLP1 do not function as the current mirror circuit, the current IoutL is turned to zero. The state in which the current IoutL=0, the voltage VoutL=VLmax, the current ISWL=ISWL1, and the voltage VSW=0 continue from time T1 to time T2. It should be noted that from time T0 to time T2, no current is carried through the V-V conversion circuit 110.

At time T2, a low signal is inputted as the input signal VinL to the electronic circuit 100. The generation circuit 130 generates low signals as the signals LP2, LP3, and LN1 and high signals as the, the signal LP1, LN2, and LN3, and transmits the signals to the corresponding switches. As a result, the switches SWLP2, SWLP3, and SWLN1 are turned off, and the switches SWLP1, SWLN2, and SWLN3 are turned on. In this case, the V-V conversion circuit 110 applies the voltage Vdd1 as the voltage VLP to the V-I conversion circuit 120. The voltage at the gate terminal of the transistor MLP1 and the voltage at the source terminal are the same voltage Vdd1, and the transistor MLP1 is turned off.

The voltage VLN applied to the V-I conversion circuit 120 by the V-V conversion circuit 110 in this case will be described. The switches SWLN2 and SWLN3 are turned on, and the transistor Mbias and the transistor MLP2 form a current mirror circuit. Thus, a current I2 is carried across the source and drain of the transistor MLP2 and across the drain and source of the transistor MLN2. That is, the current I2 is carried in the V-V conversion circuit 110. Similarly to the description in the current I1, the current I2 becomes a current corresponding to the current Iref and the ratio of size between the transistor Mbias and the transistor MLP2. For example, in the case in which the ratio of size between the transistor Mbias and the transistor MLP2 is 1:m (m is a number greater than zero), the current I2 is m×Iref. Thus, to the gate terminal of the transistor MLN2, the voltage Vbias2 determined by the relationship between the current I2 and the voltage across the gate and the source of the transistor MLN2 is generated. In this case, the V-V conversion circuit 110 applies the voltage Vbias2 as the voltage VLN to the V-I conversion circuit 120.

The transistor MLN1 with the voltage VLN applied to the gate terminal is turned on. Here, the transistor MLN1 and the transistor MLN2 form a current mirror circuit. Thus, a current I3 is carried across the drain and source of the transistor MLN1. Similarly to the description on the currents I1 and I2, the current I3 becomes a current corresponding to the current Iref and the ratio of size between the transistor MLN2 and the transistor MLN1. For example, in the case in which the ratio of size between the transistor MLN2 and the transistor MLN1 is 1:l (l is a number greater than zero), the current I3 is l×m×Iref. The V-I conversion circuit 120 outputs the current I3 as the current IoutL to the output terminal GL, and supplies the current I3 to the gate terminal of the switching device MSWL. As shown in FIG. 1, since the current IoutL has a positive value in the direction of the arrow, the current I3 has a negative value. That is, electric charges accumulated in the parasitic capacitance between the gate and source of the switching device MSWL are carried to the reference potential through the transistor MLN1. As the charge is removed from this parasitic capacitance, the voltage VoutL at the output terminal GL decreases. From time T2 to time T21, the switching device MSWL is on.

From time T2, the current I3 is kept supplied to the gate terminal of the switching device MSWL, and at time T21, the voltage VoutL reaches VLplateau. From time T21, the voltage VSW begins to rise. From time T21 to time T22, the voltage VoutL keeps VLplateau, the current ISWL keeps ISWL1, and the voltage VSW keeps rising. At time T22, the voltage VSW reaches Vbb, the current ISWL begins to drop from ISWL1, and the voltage VoutL begins to drop from VLplateau. The current ISWL is zero at time T23. The switching device MSWL is off at time T23. The switching device MSWL is switching from on to off from time T21 to T23. Here, the transition time in the case in which the switching device MSWL switches from off to on is determined corresponding to the value of the current I1, and the transition time in the case in which the switching device MSWL switches from on to off is determined corresponding to the value of the current I3. That is, the transition time Tt can be optionally set according to the current Iref generated by the reference current source 10 and the sizes of transistors included in the I-V conversion circuit 20, the V-V conversion circuit 110, and the V-I conversion circuit 120. In FIG. 2, as an example, although these transition times are both described as Tt, the transition times are not necessarily limited to the same time length.

At time T3, the generation circuit 130 switches a part of the control signal L. The generation circuit 130 generates a high signal as the signal LP2, and low signals as the signals LN2 and LN3, and transmits the signals to the corresponding switches. As a result, the switch SWLP2 switches to on, and the switches SWLN2 and SWLN3 switch to off. In regard to the control signal L other than the signals LP2, LN2, and LN3, the on and off states before time T3 are maintained. This time T3 is set such that it is considered that the switching device MSWL is turned off. For example, in the generation circuit 130, time Td is predetermined as a predetermined time relating to switching between driving and non-driving of the switching device MSWL. The generation circuit 130 may set time in a lapse of time Td from time T2 as time T3, or may set time at which the voltage VoutL reaches a predetermined voltage VtN from time T2 and after as time T3. In the present embodiment, the generation circuit 130 sets time in a lapse of time Td from time T2 as time T3, and switches a part of the control signal L.

The switches SWLP2, SWLN2, and SWLN3 are switched, and the voltage source Vdd2 is connected to the gate terminal of the transistor MLN1. Thus, the voltage Vdd2 is applied to the gate terminal of the transistor MLN1. The voltage Vdd2 is a voltage greater than the voltage Vbias2. The voltage applied to the gate terminal of the transistor MLN1 is increased, and the current IoutL becomes a negative current having an absolute value greater than the current I3 (in the following, this current is also referred to as a current ILmin). The current IoutL is the current ILmin, this more quickly decreases the voltage VoutL, and thus electric charges accumulated on the parasitic capacitance between the gate and source of the switching device MSWL can be removed for a shorter time. Even though the voltage VLN is switched from the voltage Vbias2 to the voltage Vdd2, the switching device MSWL is already off, and thus the influence on the switching of the switching device MSWL is small. When the voltage VoutL approaches zero, and the current IoutL asymptotically approaches zero. At time T3, the switches SWLN2 and SWLN3 are off, and thus no current is carried through the transistors MLP2 and MLN2. Accordingly, the power consumption of the V-V conversion circuit 110 from time T3, at which the switching device MSWL is off and later, to time T4 can be decreased.

It is assumed that the voltage VoutL keeps decreasing also from time T3 and later, and at time T31 and the voltage VoutL is turned to zero. Turning the voltage VoutL to zero means that electric charges accumulated on the parasitic capacitance between the gate and source of the switching device MSWL are removed. The voltage level of the gate terminal and the voltage level of the source terminal of the transistor MLN1 become similar, and thus the transistor MLN1 is turned off. After the turning off, no change is observed in the states of the switching device MSWL and the electronic circuit 100 to time T4.

At time T4, a high signal is inputted as the input signal VinL to the electronic circuit 100. In the following, the drive system is similarly operated rom time T0 to time T4 described above.

As described above, the drive system according to the present embodiment is described. The drawings, for example, in the present embodiment are examples for description, and some drawings have partially different representation. For example, although the switching device MSWL, the reference current source 10, the I-V conversion circuit 20, and the current adjustment circuit 30 are described separately from the electronic circuit 100, the electronic circuit 100 may include at least one of these components. In the present embodiment, although the voltage source Vref is included in the reference current source 10 and the voltage sources Vdd1 and Vdd2 are included in the electronic circuit 100, at least one of these voltage sources is externally disposed, and a corresponding voltage may be applied from an external voltage source to the reference current source 10 or the electronic circuit 100. In FIG. 2, although the current levels of the currents IoutL and ISWL and the voltage levels of the voltages VoutL and VSW are described by straight lines for explanation, a part of the voltage levels may be curves. Although the signals LP1 to LN3 look like simultaneously switching, the switching does not necessarily have to be performed simultaneously as long as the switching has no influence on the switching of the switching device MSWL.

Exemplary modifications of the present embodiment can be variously mounted and performed. In the following, an exemplary modification of the present embodiment will be described.

Exemplary Modification

Figure 3:
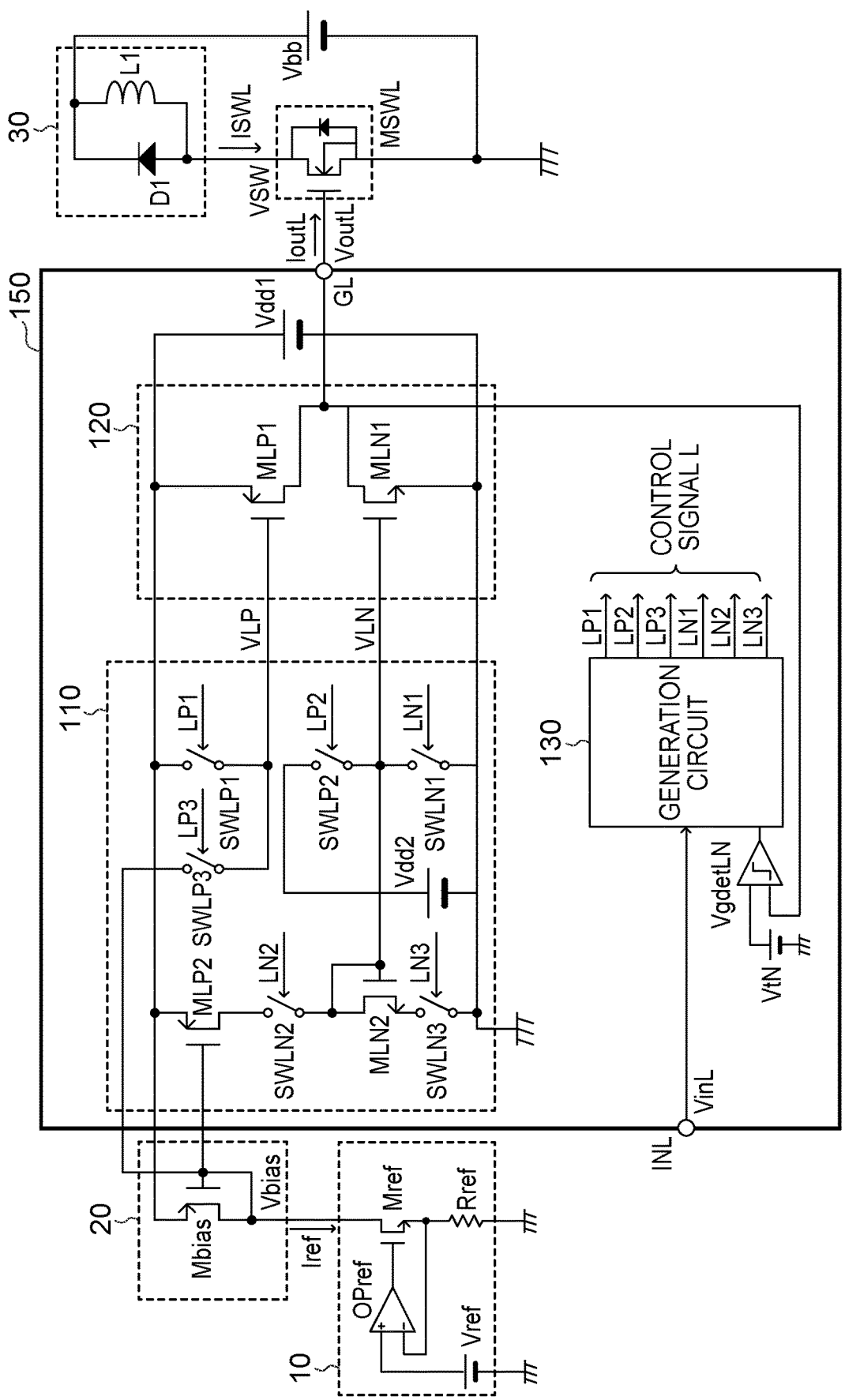
FIG. 3 is a drive system diagram including the configuration of an electronic circuit applicable to the first embodiment.

An electronic circuit 150 of an exemplary modification includes a voltage source VtN and a comparator VgdetLN that compares a voltage VoutL with a predetermined voltage (in the following, also referred to as a voltage VtN) generated by the voltage source VtN in a generator 130. FIG. 3 shows a block diagram of a drive system including the electronic circuit 150. As described the present embodiment, the generator 130 switches a part of the control signal L at time (time T3) at which the voltage VoutL is turned to the voltage VtN. The control signal L is switched at time T3, no current is carried through the V-V conversion circuit 110, and thus the power consumption of the electronic circuit 100 can be decreased. The voltage VtN is set from the gate voltage at which the switching device MSWL is off. It should be noted that a configuration may be provided in which at least one of the voltage source VtN and the comparator VgdetLN may be externally disposed from the electronic circuit 100 and a comparison result of the voltage VtN or the comparator VgdetLN with VoutL may be inputted to the generation circuit 130.

As described above, the exemplary modification of the present embodiment is described. The electronic circuit of the present embodiment switches a part of the control signal after the transition of the switching device MSWL in the switching of the switching device MSWL. Thus, the power consumption of the electronic circuit can be decreased while suppressing the influence on the switching of the switching device MSWL.

Second Embodiment

Figure 4:
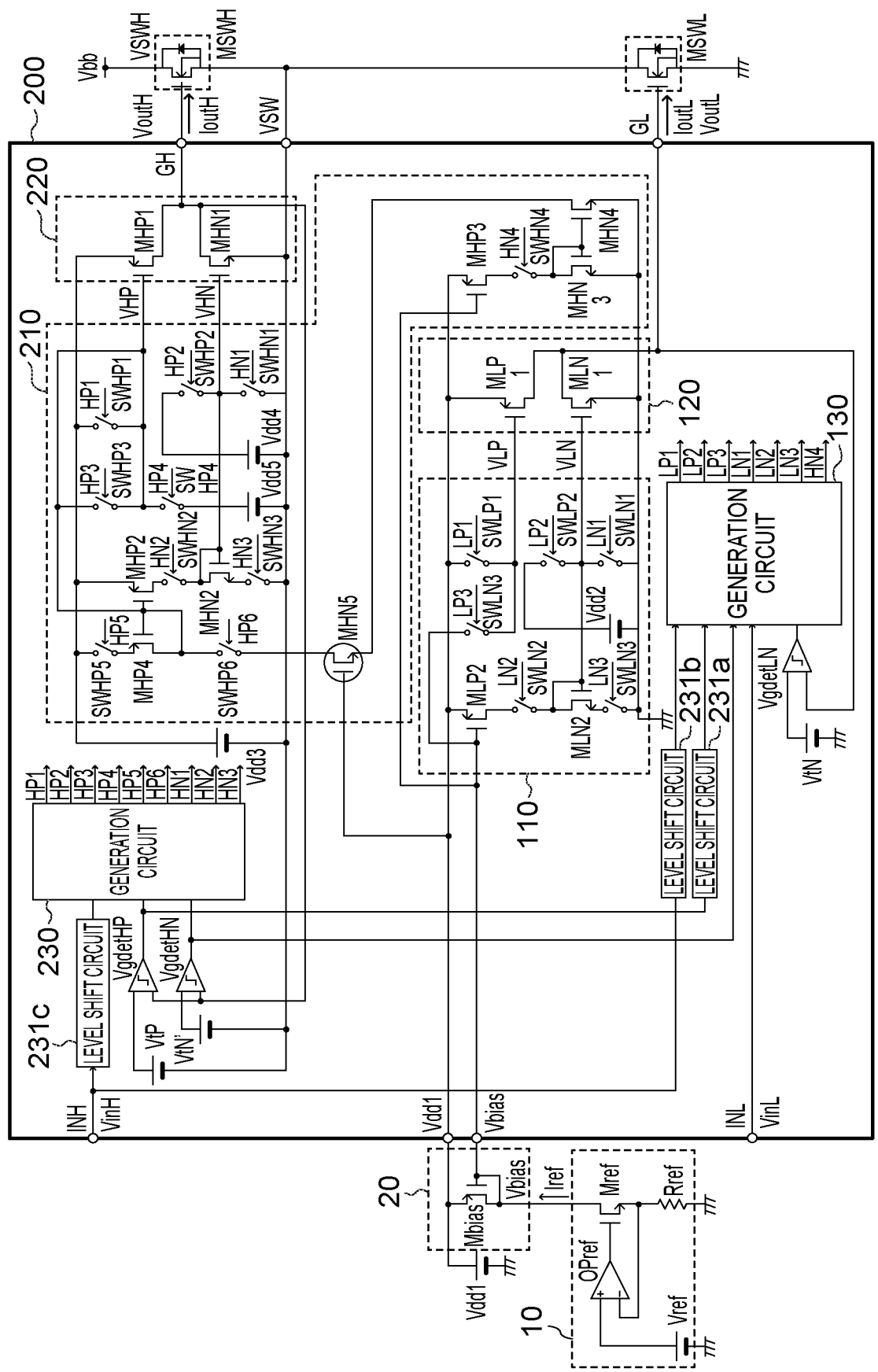
FIG. 4 is a drive system diagram including the configuration of an electronic circuit according to a second embodiment.

FIG. 4 shows a drive system according to the present embodiment. This drive system includes switching devices MSWL and MSWH, a reference current source 10, an I-V conversion circuit 20, and an electronic circuit 200 that drives the switching devices MSWL and MSWH.

The switching device MSWH is similar to the switching device MSWL described in the first embodiment, and the description is omitted. The gate terminal of the switching device MSWH is connected to an electronic circuit 200, the drain terminal is connected to the voltage source Vbb, the source terminal is connected to the drain terminal of the switching device MSWL. Here, the reference potential of the switching device MSWH is a potential at the drain terminal of the switching device MSWL, and is different from the reference potential of the switching device MSWL (e.g. a ground). In the present embodiment, the reference potential of the switching device MSWH is described as a voltage VSW. Switching devices in series like the switching devices MSWL and MSWH are also referred to as half bridges. Although the voltage VSW of the present embodiment is the reference potential of the switching device MSWH, the voltage VSW can have various values, not limited to a certain voltage.

The electronic circuit 200 receives an input signal VinL relating to the driving and non-driving of the switching device MSWL and an input signal VinH relating to the driving and non-driving of the switching device MSWH, controls currents to be supplied to the switching devices MSWL and MSWH, and then switches the switching devices MSWL and MSWH. In the following, a current to be supplied to the switching device MSWH by the electronic circuit 200 is also referred to as IoutH. Like the electronic circuit 200, the electronic circuit 200 that drives half bridges is also referred to as a half bridge driver. In addition to the electronic circuit 150 described in the first embodiment, the electronic circuit 200 includes a voltage-to-voltage conversion circuit 210 (in the following, also referred to as a V-V conversion circuit 210), a voltage-to-current conversion circuit 220 (in the following, also referred to as a V-I conversion circuit 220), a generation circuit 230, level shift circuits 231a, 231b, and 231c, voltage sources Vdd3, VtP, and VtN', and comparators VgdetHN and VgdetHP.

The reference potential of the electronic circuit 200 is varied depending on the components of the electronic circuit 200. For example, the reference potentials of the components described in the first embodiment or the reference potentials of a part of the components included in the V-V conversion circuit 210 become the reference potential of the switching device MSWL. On the other hand, the reference potentials of a part of the components included in the V-V conversion circuit 210 and the reference potentials of the V-I conversion circuit 220, the voltage sources Vdd3, VtP, ad VtN', and the comparators VgdetHN and VgdetHP, for example, become the voltage VSW.

The V-V conversion circuit 210 is connected to the I-V conversion circuit 20, the V-I conversion circuit 220, and the voltage source Vdd3. The V-I conversion circuit 220 is also connected to an output terminal GH. The generation circuit 230 is connected to an input terminal INH through the level shift circuit 231c, and connected to the comparators VgdetHP and VgdetHN. The level shift circuit 231a is connected between the generation circuit 230 and the comparator VgdetHN and to the generation circuit 130. The level shift circuit 231b is connected between the generation circuit 230 and the comparator VgdetHP and to the generation circuit 130. The comparator VgdetHN is connected to the voltage source VtN and to the V-I conversion circuit 220. The comparator VgdetHP is connected to the voltage source VtP and to the voltage VSW.

Figure 5:
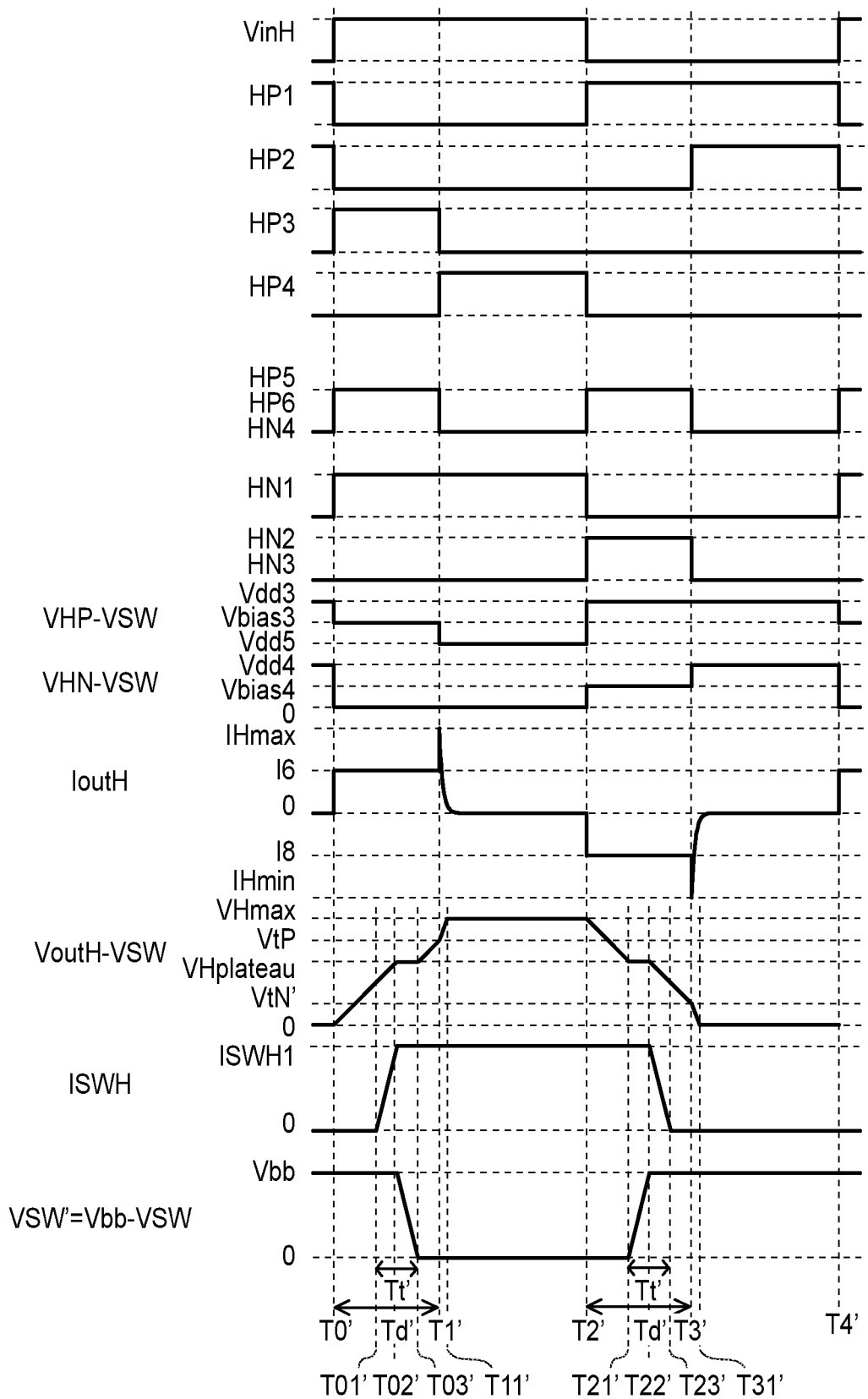
FIG. 5 is a timing chart of a drive system according to the second embodiment.

The V-V conversion circuit 210 generates voltages to be applied to the V-I conversion circuit 220. The voltages generated by the V-V conversion circuit 210 are also referred to as a voltage VHP and a voltage VHN. As the voltage VHP and the voltage VHN, any of a predetermined voltage generated by the voltage source Vdd3 (in the following, also referred to as a voltage Vdd3), a predetermined voltage generated by a voltage source Vdd4 (in the following, also referred to as a voltage Vdd4), a predetermined voltage generated by a voltage source Vdd5 (in the following, also referred to as a voltage Vdd5), and a voltage based on a current carried through in the V-V conversion circuit 210 (in the following, also referred to as a voltage Vbias3 and a voltage Vbias4) is outputted (these voltages will be described later). Since the reference potential is the voltage VSW, the voltage VSW is applied in these voltages with reference to the reference potential of the switching device MSWL. In the present embodiment, as shown in FIG. 5, as the voltage VHP, any of a voltage Vdd3+VSW, a voltage Vdd5+VSW, or a voltage Vbias3+VSW is supplied, and as the voltage VHN, any of a voltage Vdd4+VSW, a voltage VSW, or a voltage Vbias4+VSW is supplied.

The V-V conversion circuit 210 includes a transistor MHP2, a transistor MHP3, a transistor MHP4, a transistor MHN2, a transistor MHN3, a transistor MHN4, a transistor MHN5, a switch SWHP1, a switch SWHP2, a switch SWHP3, a switch SWHP4, a switch SWHP5, a switch SWHP6, a switch SWHN1, a switch SWHN2, a switch SWHN3, a switch SWHN4, and the voltage source Vdd4, and the voltage source Vdd5.

The reference potential of the V-V conversion circuit 210 is varied depending on the components of the V-V conversion circuit 210. For example, the reference potentials of the transistors MHP3, MHN3, and MHN4 become the reference potential of the switching device MSWL. On the other hand, the reference potentials of a transistors MHP1, and the transistors MHP2, MHP4, MHN1, and MHN2 and the voltage sources Vdd4 and Vdd5 became the voltage VSW.

The transistors MHP2, MHP3, and MHP4 are P-type transistors in the present embodiment. The gate terminal of the transistor MHP2 is connected to the gate terminal of the transistor MHP4, the source terminal is connected to the voltage source Vdd1, and the drain terminal is connected to the switch SWHN2. The gate terminal of the transistor MHP3 is connected to the I-V conversion circuit 20, the source terminal is connected to the voltage source Vdd1, and the drain terminal is connected to the switch SWHN4.

The source terminal of the transistor MHP4 is connected to the switch SWHP5, and the drain terminal is connected to the switch SWHP6. In the transistor MHP4, the gate terminal and the drain terminal are contented.

The transistor MHN2, the transistor MHN3, the transistor MHN4, and the transistor MHN5 are N-type transistors in the present embodiment. The gate terminal of the transistor MHN2 is connected to the V-I conversion circuit 220, the source terminal is connected to the switch SWHN3, and the drain terminal is connected to the switch SWHN2. In the transistor MHN2, the gate terminal and the drain terminal are connected.

The drain terminal of the transistor MHN2 is connected to the switch SWHN2, and the source terminal is connected to the switch SWHN3. In the transistor MHN2, the gate terminal and the drain terminal are connected. The gate terminal of the transistor MHN3 is connected to the gate terminal of the transistor MHN4, the source terminal is connected to the reference potential, and the drain terminal is connected to the switch SWHN4. In the transistor MHN3, the gate terminal and the drain terminal are connected. The source terminal of the transistor MHN4 is connected to the reference potential, and the drain terminal is connected to the source terminal of the transistor MHN5. The transistor MHN5 is a high breakdown voltage transistor. The reference potential on the side where the source terminal of the transistor MHN5 is connected is the reference potential of the switching device MSWL, and the reference potential on the side where the drain terminal of the transistor MHN5 is connected is the voltage VSW. Thus, differences in the reference potential can be absorbed, and the destruction of the circuit can be prevented. The gate terminal of the transistor MHN5 is connected to the voltage source Vdd1, and the drain terminal is connected to the switch SWHP6.

The switch SWHP1, the switch SWHP2, the switch SWHP3, the switch SWHP4, the switch SWHP5, the switch SWHP6, the switch SWHN1, the switch SWHN2, and the switch SWHN3 are short-circuited or opened by signals from the generation circuit 230. The switch SWHN4 is short-circuited or opened by a signal from the generation circuit 130. The V-V conversion circuit 210 switches any of the voltage Vdd3, Vdd4, or Vdd5, and a voltage based on a current carried through in the V-V conversion circuit 210 corresponding to the short-circuited or opened state of the switches SWHP1 to SWHP6 and SWHN1 to SWHN4, and applies these voltages as the voltage VHP and the voltage VHN to the V-I conversion circuit 220.

The switch SWHP1 is connected between the voltage source Vdd3 and the V-I conversion circuit 220. The switch SWHP2 is connected between the voltage source Vdd4 and the V-I conversion circuit 220. The switch SWHP3 is connected between the gate terminal of the transistor MHP2 and the gate terminal of the transistor MHP4 and between the gate terminals and the V-I conversion circuit 220. The switch SWHP4 is connected between the voltage source Vdd5 and the V-I conversion circuit 220. The switch SWHP5 is connected between the voltage source Vdd3 and the source terminal of the transistor MHP4. The switch SWHP6 is connected between the drain terminal of the transistor MHP4 and the drain terminal of the transistor MHN5. The switch SWHN1 is connected between the voltage VSW and the V-I conversion circuit 220. The switch SWHN2 is connected between the drain terminal of the transistor MHP2 and the drain terminal of the transistor MHN2. The switch SWHN3 is connected between the source terminal of the transistor MHN2 and the voltage VSW. The switch SWHN4 is connected between the drain terminal of the transistor MHP3 and the drain terminal of the transistor MHN3.

The V-I conversion circuit 220 generates an output current to be outputted to the gate terminal of the switching device MSWH based on at least one of the voltages VHP and VHN applied from the V-V conversion circuit 210. This output current is supplied to the gate terminal of the switching device MSWH through the output terminal GH. In FIG. 4, a voltage at the output terminal GH is described as VoutH (in the following, also referred to as a voltage VoutH), and an output current is described as IoutH. The V-I conversion circuit 220 includes the transistor MHP1 and the transistor MHN1.

The transistor MHP1 is a P-type transistor as an example in the present embodiment. The gate terminal of the transistor MHP1 is connected between the gate terminal of the transistor MHP4 and the switches SWHP1, SWHP3, and SWHP4, and the gate terminal of the transistor MHP2. The voltage VHP generated by the V-V conversion circuit 210 is applied to the gate terminal of the transistor MHP1. The source terminal of the transistor MHP1 is connected to the voltage source Vdd1. The drain terminal of the transistor MHP1 is connected to the output terminal GH and the drain terminal of the transistor MHN1. The transistor MHN1 is an N-type transistor as an example in the present embodiment. The gate terminal of transistor MHN1 is connected to the gate terminals of switches SWHN1, SWHP2, and transistor MHN2. The voltage VHN generated by the V-V conversion circuit 210 is applied to the gate terminal of the transistor MHN1. The source terminal of the transistor MHN1 is connected to the voltage VSW. The drain terminal of the transistor MHP1 is connected to the output terminal GH and the drain terminal of the transistor MHP1.

The generation circuit 230 generates a control signal H that controls the short-circuiting or opening of the switch SWHP1, the switch SWHP2, the switch SWHP3, the switch SWHP4, the switch SWHP5, the switch SWHP6, the switch SWHN1, the switch SWHN2, and the switch SWHN3 based on the input signal VinH from the input terminal INH. This input signal VinH is a signal relating to the driving or non-driving of the switching device MSWH. The control signal H includes signals HP1, HP2, HP3, HP4, HP5, HP6, HN1, HN2, and HN3. The signal HP1 corresponds to the switch SWHP1, the signal HP2 corresponds to the switch SWHP2, the signal HP3 corresponds to the switch SWHP3, the signal HP4 corresponds to the switch SWHP4, the signal HP5 corresponds to the switch SWHP5, the signal HP6 corresponds to the switch SWHP6, the signal HN1 corresponds to the switch SWHN1, the signal HN2 corresponds to the switch SWHN2, and the signal HN3 corresponds to the switch SWHN3. The generation circuit 230 transmits the signals HP1 to HP6 and HN1 to HN3 to the corresponding switches. A method of transmitting the signals HP1 to HP6 and HN1 to HN3 is optional; the method may be a cable, or may be a wireless manner.

The generation circuit 130 described in the first embodiment further generates a signal HN4 that controls the short-circuiting or opening of the switch SWHN4 based on the input signal VinH from the input terminal INH. The signal HN4 is included in the control signal L. The generation circuit 130 transmits the signal HN4 to the switch SWHN4. A method of transmitting the signal HN4 may be a cable, or may be a wireless manner.

The level shift circuits 231*a*, 231*b*, and 231*c* are circuits that adjust the voltage level of the input signal. To the level shift circuits 231*a* and 231*b*, a signal indicating a comparison result of the comparators VgdetHN and VgdetHP based on the voltage VSW is inputted. The level shift circuits 231*a* and 231*b* adjust the signal indicating the comparison result to a voltage suited to the generation circuit 130 based on the reference potential of the switching device MSWL, and sends the voltage to the generation circuit 130. The level shift circuit 231*c* adjusts the input signal VinH based on the reference potential to a voltage suited to the generation circuit 230 based on the voltage VSW, and sends the voltage to the generation circuit 230.

The level shift circuit 231*a* is connected between the generation circuit 230 and the comparator VgdetHN and connected to the generation circuit 130. The level shift circuit 231*b* is connected between the generation circuit 230 and the comparator VgdetHP and connected to the generation circuit 130. The level shift circuit 231*c* is connected to the input terminal INH and to the generation circuit 230.

The comparator VgdetHN compares the voltage VoutH with the voltage VtN', and sends a signal indicating the compared result to the generation circuit 130 through the generation circuit 230 and the level shift circuit 231*a*. In detail, since the reference potential of the voltage source VtN' is the voltage VSW, the comparator VgdetHN compares the voltage VoutH-VSW with the voltage VtN'. The comparator VgdetHP compares the voltage VoutH-VSW with the voltage VtP, and sends a signal indicating the compared result to the generation circuit 130 through the generation circuit 230 and the level shift circuit 231*b*. In detail, since the reference potential of the voltage source VtP is the voltage VSW, the comparator VgdetHP compares the voltage VoutH-VSW with the voltage VtP. These signals indicating the compared results are used for switching a part of the signals in the control signal L generated by the generation circuit 130 and the control signal H generated by the generation circuit 230.

As described above, the configuration of the drive system of the present embodiment is described. To the electronic circuit 200, the mounting method and the implementation method similar to those of the electronic circuit 100 described in the first embodiment is applicable.

FIG. 5 is a timing chart of the drive system of the present embodiment, describing a timing chart for a part relating to the driving of the switching device MSWH. Referring to FIG. 5, in the drive system of the present embodiment, the operation of a part relating to the driving of the switching device MSWH will be described from time T0' to time T4'. These times may be linked together with time T0 to time T4 in the first embodiment, or may not be linked together. That is, driving the switching device MSWL and driving the switching device MSWH may be independently performed, or one switching device may depend on the other switching device. It should be noted that in the drive system of the present embodiment, the operation of a part relating to the driving of the switching device MSWL is similar to the timing chart described in the first embodiment, and the description is omitted. It should be noted that in FIG. 5, the voltages VHP, VHN, and VoutH are described with the subtraction of the voltage VSW that is the reference potential of the switching device MSWH. In the expression, a voltage VSW'=Vbb−VSW.

In regard to the input signal VinH, a high signal is inputted from time T0' to time T2', and a low signal is inputted from time T2' to time T4'. In FIG. 5, the high signal is described as H, and the low signal is described as L. In the case in which the electronic circuit 200 receives a high signal as the input signal VinH, the electronic circuit 200 generates an output current to as to drive the switching device MSWH. In the case in which the electronic circuit 200 receives a low signal as input signal VinH, the electronic circuit 200 generates an output current to as not to drive the switching device MSWH. It should be noted that similarly to the first embodiment, a time lag occurs from the reception of the high signal as the input signal VinH by the electronic circuit 200 to the actual driving of the switching device MSWH or from the reception of the low signal as the input signal VinH by the electronic circuit 200 to the actual non-driving of the switching device MSWH. To the electronic circuit 200, the voltage Vbias based on the current Iref generated by the reference current source 10 is applied by the I-V conversion circuit 20. The transistor Mbias of this I-V conversion circuit 20 is on. To the gate terminal of the transistor MHN5, the voltage Vdd1 is applied, and the transistor MHN5 is turned on.

At time T0', a high signal is inputted as the input signal VinH to the electronic circuit 200. The generation circuit 130 generates a high signal as the signal HN4, and transmits the signal to the switch SWHN4. The generation circuit 230 generates low signals as the signals HP1, HP2, HP4, HN2, and HN3, and generates high signals as the signals HP3, HP5, and HP6, and transmits the signals to the corresponding switches. As a result, the switches SWHP1, SWHP2, SWHP4, SWHN2, and SWHN3 are turned off, and the switches SWHP3, SWHP5, SWHP6, and SWHN4 are turned on.

The switch SWHN4 is turned on, and the transistor Mbias and the transistor MHP3 form a current mirror circuit. Thus, a current I4 is carried across the source and drain of the transistor MHP3 and across the drain and source of the transistor MHN3. That is, the current I4 is carried in a part of the V-V conversion circuit 210. Similarly to the currents I1 to I3, the current I4 becomes a current corresponding to the current Iref and the ratio of size between the transistor Mbias and the transistor MHP3. For example, in the case in which the ratio of size between the transistor Mbias and the transistor MHP3 is 1:k (k is a number greater than zero), the current I4 becomes a current k×Iref.

The switches SWHP5 and SWHP6 are turned on, and the transistor MHN3 and the transistor MHN4 form a current mirror circuit. Thus, a current I5 is carried from the switch SWHP5 through the transistor MHP4, the switch SWHP6, the transistor MHN5, and the transistor MHN4. That is, the current I5 is carried in a part of the V-V conversion circuit 210. Similarly to the currents I1 to I4, the current I5 becomes a current corresponding to the current Iref and the ratio of size between the transistor MHN3 and the transistor MHN4. For example, in the case in which the ratio of size between the transistor MHN3 and the transistor MHN4 is 1:j (j is a number greater than zero), the current I5 becomes a current j×k×Iref. Thus, at the gate terminal of the transistor MHP4, a voltage Vbias3+VSW determined by the relationship between the current I5 and the voltage across the gate and the source of the transistor MHP4 is generated. The V-V conversion circuit 210 applies the voltage Vbias3+VSW as the voltage VHP to the V-I conversion circuit 220. This voltage Vbias3+VSW turns on the transistor MHP1. On the other hand, since the voltage VHN becomes the voltage VSW and is the reference potential of the switching device MSWH, the transistor MHN1 is turned off.

Here, the transistor MHP1 is turned on, and the transistor MHP4 and the transistor MHP1 form a current mirror circuit. Thus, a current I6 is carried across the drain and source of the transistor MHP1. Similarly to the description on the currents I1 to I5, the current I6 becomes a current corresponding to the current Iref and the ratio of size between the transistor MHP4 and the transistor MHP1. For example, in the case in which the ratio of size between the transistor MHP4 and the transistor MHP1 is 1:i (i is a number greater than zero), the current I6 becomes i×j×k×Iref. The V-I conversion circuit 220 outputs the current I6 as the current IoutH to the output terminal GH, and the current I6 is supplied to the gate terminal of the switching device MSWH. As shown in FIG. 4, the current IoutH has a positive value in the direction of an arrow, and the current I6 has a positive value. That is, electric charges are accumulated in the parasitic capacitance between the gate and source of the switching device MSWH. As electric charges are accumulated in this parasitic capacitance, the voltage VoutH-VSW is increased. From time T0' to time T01', the switching device MSWH is off.

From time T0', the current I6 is kept supplied to the gate terminal of the switching device MSWH, and at time T01', a current (in the following, this current is a current ISWH) begins to be carried across the drain and source of the switching device MSWH. At time T02', the voltage VoutH-VSW reaches VHplateau that is a specific value. At this voltage VoutH-VSW=VHplateau, the current ISWH reaches ISWH1 that is a specific value, and the voltage VSW' across the drain and source of the switching device MSWH drops. The voltage VSW' drops from the voltage Vbb to zero. From time T02' to time T03', the voltage VoutH-VSW keeps the voltage VHplateau, the current ISWH keeps ISWH1, and the voltage VSW' keeps dropping. It should be noted that keeping the voltage VHplateau and ISWH1 is not limited to strictly keeping the same value, and the similar level only has to be kept. The voltage VSW' is turned to zero at time T03'. The switching device MSWH is on at time T03'. The switching device MSWH is switching from off to on from time TO1' to T03' (time Tt'). Time Tt' is time at which the switching device MSWH switches from off to on or on to off, and is referred to as transition time or time in which the switching device MSWH is transitioning, for example, similarly to the first embodiment. The transition time in the case in which the switching device MSWH switches from off to on is determined corresponding to the value of the current I6, and the transition time in the case in which the switching device MSWH switches from on to off is determined corresponding to the value of a current I8, described later. That is, the transition time Tt' can be optionally set according to the current Iref generated by the reference current source 10 and the sizes of transistors included in the I-V conversion circuit 20, the V-V conversion circuit 210, and the V-I conversion circuit 220. In FIG. 5 as an example, these transition times are together described as Tt', which are not necessarily limited to the same time length. The transition time Tt' of the present embodiment may be similar to the transition time Tt described in the first embodiment, or may be different.

The voltage VoutH-VSW again increases the voltage from time T03'. At time T1', the generation circuit 130 switches a part of the control signal L, and the generation circuit 230 switches a part of the control signal H. The generation circuit 130 generates a low signal as the signal HN4, and transmits the signal to the switch SWHN4. The generation circuit 230 generates low signals as the signals HP3, HP5, and HP6 and a high signal as the signal HP4, and transmits the signals to the corresponding switches. As a result, the switch SWHP4 switches to on, and the switches SWHP3, SWHP5, SWHP6, and SWHN4 switch to off. In regard to the control signal H other than the signals HP3, HP4, HP5, HP6, signals having switched at time T0' are kept. This time T1' is set such that time T1' is time at which the switching device MSWH is considered to be turned on. For example, the generation circuits 130 and 230 determines time Td' in advance as a predetermined time relating to switching between driving and non-driving of the switching device MSWH. The generation circuits 130 and 230 may set time a lapse of time Td' from time T0' as time T1', or may set time at which the voltage VoutH-VSW reaches the predetermined voltage VtP at time T0' or later as time T1'. In the present embodiment, the generation circuits 130 and 230 receive a signal indicating the comparison result of the voltage VoutH-VSW with the voltage VtP by the comparator VgdetHP, and witch a part of the signal HN4 and the control signal H setting time at which the voltage VoutH-VSW becomes the voltage VtP (time at which the comparison result changes) as time T1'.

The switch SWHP3, SWHP4, SWHP5, SWHP6, and SWHN4 are switched, and the voltage source Vdd5 is connected to the gate terminal of the transistor MHP1. Thus, a voltage Vdd5+VSW is applied as the voltage VHP to the gate terminal of the transistor MHP1. The voltage Vdd5 is a voltage smaller than the voltage Vbias3. The voltage applied to the gate terminal of the transistor MHP1 is made smaller, and the current IoutH is a current greater than the current I6 (in the following, this current is also referred to as a current IHmax). The current IoutH becomes the current IHmax, the voltage VoutH more quickly rises, and electric charges can be accumulated for much shorter time on the parasitic capacitance between the gate and source of the switching device MSWH. Even though the voltage VHP is switched from the voltage Vbias3+VSW to the voltage Vdd5+VSW, the switching device MSWH is already on, and the influence on the switching of the switching device MSWH is small. When the voltage VoutH-VSW comes close to VHmax, the current IoutH has asymptotically approaches zero.

At time T1', the switches SWHP3, SWHP5, SWHP6, and SWHN4 are turned off, and thus no current is carried through the transistor MHP3, MHN3, MHN4, and MHP4. Accordingly, from time T1' at which the switching device MSWH is on and later, the power consumption of the V-V conversion circuit 210 to time T2' can be decreased.

It is assumed that the voltage VoutH-VSW keeps rising as well after time T1' and later, and at time T11', the voltage VoutH-VSW becomes VHmax. Turning the voltage VoutH-VSW to VHmax means that electric charges are fully accumulated on the parasitic capacitance between the gate and source of the switching device MSWH. At this time, since the voltage (=Vdd3+VSW) at the source terminal of the transistor MHP1 and the voltage (=VHmax+VSW) at the drain terminal are at the same level, the transistor MHP1 is turned from on to off. At this time, the current IoutH is turned to zero. In the following, in the switching device MSWH and the electronic circuit 200 to time T2', no change is observed in the state relating to the switching of the switching device MSWH.

At time T2', a low signal is inputted as the input signal VinH to the electronic circuit 200. At time T2', the generation circuit 130 switches a part of the control signal L, and the generation circuit 230 switches a part of the control signal H. The generation circuit 130 generates a high signal as the signal HN4, and transmits the signal to the switch SWHN4. The generation circuit 230 generates low signals as the signals HP4 and HN1 and high signals as the signals HP1, HP5, HP6, HN2, and HN3, and transmits the signals to the corresponding switches. As a result, the switches SWHP4 and SWHN1 are turned off, and the switches SWHP1, SWHP5, SWHP6, SWHN2, and SWHN3 are turned on. The switch SWHP2 keeps off. In this case, the V-V conversion circuit 210 applies the voltage Vdd3+VSW as the voltage VHP to the V-I conversion circuit 220. The voltage at the gate terminal of the transistor MHP1 and the voltage at the source terminal become the same voltage Vdd3+VSW, and the transistor MHP1 is turned off.

In the following, the voltage VHN at time T2' will be described. The switch SWHN4 is turned on, and the transistor Mbias and the transistor MHP3 form a current mirror circuit. Thus, a current I4 is carried across the source and drain of the transistor MHP3 and across the drain and source of the transistor MHN3. That is, the current I4 is carried in a part of the V-V conversion circuit 210. The switches SWHP5 and SWHP6 are turned on, and the transistor MHN3 and the transistor MHN4 form a current mirror circuit. Thus, a current I5 is carried from the switch SWHP5 through the transistor MHP4, the switch SWHP6, the transistor MHN5, and the transistor MHN4. That is, the current I5 is carried in a part of the V-V conversion circuit 210.

The switch SWHN2 and SWHN3 are turned on, the transistor MHP4 and the transistor MHP2 form a current mirror circuit. Thus, a current I7 is carried from the transistor MHP2 through the switch SWHN2, the transistor MHN2, and the switch SWHN3. That is, the current I7 is carried in a part of the V-V conversion circuit 210. Similarly to the currents I1 to I6, the current I5 becomes a current corresponding to the current Iref and the ratio of size between the transistor MHP4 and the transistor MHP2. For example, in the case in which the ratio of size between the transistor MHP4 and the transistor MHP2 is 1:h (h is a number greater than zero), the current I7 becomes a current h×j×k×Iref. Thus, at the gate terminal of the transistor MHN2, the voltage Vbias4+VSW determined by the relationship between the current I7 and the voltage across the gate and the source of the transistor MHP2 is generated. The V-V conversion circuit 210 applies the voltage Vbias4+VSW as the voltage VHN to the V-I conversion circuit 220. This voltage Vbias4 turns on the transistor MHN1.

Here, the transistor MHN2 and the transistor MHN1 form a current mirror circuit. Thus, a current I8 is carried across the drain and source of the transistor MHN1. Similarly to the description on the currents I1 and I2, the current I8 becomes a current corresponding to the current Iref and the ratio of size between the transistor MHN2 and the transistor MHN1. For example, in the case in which the ratio of size between the transistor MHN2 and the transistor MHN1 is 1:g (g is a number greater than zero), the current I8 becomes g×h×j×k×Iref. The V-I conversion circuit 220 outputs the current I8 as the current IoutH to the output terminal GH, and supplies the current I8 to the gate terminal of the switching device MSWH. As shown in FIG. 4, the current IoutH has a positive value in the direction of the arrow, and the current I8 has a negative value. That is, electric charges accumulated in the parasitic capacitance between the gate and source of the switching device MSWH are passed to the reference potential of the switching device MSWH through the transistor MHN1. As electric charges are removed from this parasitic capacitance, the voltage VoutH-VSW is decreased. From time T2' to time T21', the switching device MSWH is on.

From time T2', the current I8 is kept supplied to the gate terminal of the switching device MSWH, and at time T21', the voltage VoutH-VSW reaches VHplateau. From time T21', the voltage VSW' begins to rise. The voltage VSW' rises from zero to Vbb. From time T21' to time T22', the voltage VoutH-VSW keeps VHplateau, the current ISWH keeps ISWH1, and the voltage VSW' is kept rising. At time T22, the voltage VSW' reaches Vbb, the current ISWH begins to drop from ISWH1, and the voltage VoutH-VSW begins to drop from VHplateau. The current ISWH is turned to zero at time T23'. The switching device MSWH is off at time T23'. The switching device MSWH is switching from on to off from time T21' to time T23'. In FIG. 5, the time zone from time T21' to time T23' is set to the transition time Tt', and time different from the time zone time T01' to time T03' may be set to transition time.

The voltage VoutH-VSW again drops from time T23'. At time T3', the generation circuit 130 switches a part of the control signal L, and the generation circuit 230 switches a part of the control signal H. The generation circuit 130 generates a low signal as the signal HN4, and transmits the signal to the switch SWHN4. The generation circuit 230 generates low signals as the signals HP5, HP6, HN2, and HN3 and a high signal as the signal HP2, and transmits the signals to the corresponding switches. As a result, the switch SWHP2 is turned to on, and the switches SWHP5, SWHP6, SWHN2, SWHN3, and SWHN4 are turned to off. In regard to the control signal H other than the signals HP2, HP5, HP6, HN2, and HN3, the on and off states before time T3' are maintained. This time T3' is set to time at which it is considered that the switching device MSWH is turned to off. For example, the generation circuits 130 and 230 determines time Td' in advance as a predetermined time relating to switching between driving and non-driving of the switching device MSWH. The generation circuits 130 and 230 may set time in a lapse of time Td' from time T2' as time T3', or may set time at which the voltage VoutH-VSW reaches a predetermined voltage VtN' at time T2' and later as time T1'. For time Td', time different from the time zone from time T0' to time T1' may be set. In the present embodiment, the generation circuits 130 and 230 receive a signal indicating the comparison result of the voltage VoutH-VSW with the voltage VtN' by the comparator VgdetHN, and switch a part of the signal HN4 and the control signal H at the time at which the voltage VoutH-VSW becomes the voltage VtN' (the time at which the comparison result changes) as time T3'.

The switches SWHP2, SWHP5, SWHP6, SWHN2, SWHN3, and SWHN4 are switched, and the voltage source Vdd4 is connected to the gate terminal of the transistor MHN1. Thus, to the gate terminal of the transistor MHN1, the voltage Vdd4+VSW is applied as the voltage VHN. The voltage Vdd4 is a voltage higher than the voltage Vbias4. As the voltage applied to the gate terminal of the transistor MHN1 increases, the current IoutH becomes a negative current having an absolute value larger than the current I8 (in the following, this current is also referred to as a current IHmin). The current IoutH becomes the current IHmin, the voltage VoutH more quickly drops, and electric charges accumulated in the parasitic capacitance between the gate and source of the switching device MSWH can be removed for a shorter time. Even though the voltage VHN is switched from the voltage Vbias4+VSW to the voltage Vdd4+VSW, the switching device MSWH is already off, and thus the influence on the switching of the switching device MSWH is small. The voltage VoutH-VSW approaches zero, and the current IoutH asymptotically approaches zero.

At time T3', the switches SWHP5, SWHP6, SWHN2, SWHN3, and SWHN4 are off, and thus no current is carried through the transistor MHP2, MHP3, MHP4, MHN2, MHN3, and MHN4. Accordingly, at time T3' at which the switching device MSWH is off and later, the power consumption of the V-V conversion circuit 210 to time T4' can be decreased.

It is summed that the voltage VoutH-VSW keeps decreasing after time T3' and later and at time T31', the voltage VoutH-VSW is turned to zero. Turning the voltage VoutH-VSW to zero means that electric charges accumulated in the parasitic capacitance between the gate and source of the switching device MSWH are removed. At this time, since the voltage level of the drain terminal of the transistor MHN1 and the voltage level of the source terminal are almost the same, the transistor MHN1 is turned off. After that, in the switching device MSWH, and the electronic circuit 200, no change is observed in the state of the switching of the switching device MSWH until time T4'.

At time T4', a high signal is inputted as the input signal VinH to the electronic circuit 200. In the following, the drive system is similarly operated from time T0' to time T4' described above.

As described above, the drive system according to the present embodiment is described. The drawings, for example, in the present embodiment are examples for description, and some drawings have partially different representation. For example, the switching devices MSWL and MSWH, the reference current source 10, and the I-V conversion circuit 20 are described separately from the electronic circuit 200. However, the electronic circuit 200 may include at least one of these components. In the present embodiment, the voltage source Vref is included in the reference current source 10, and the voltage sources Vdd3, Vdd4, and Vdd5 are included in the electronic circuit 200. However, at least one of these voltage sources is externally disposed, and the corresponding voltage may be applied from an external voltage source to the reference current source 10 or the electronic circuit 200. In FIG. 5, the current levels of the current IoutH and ISWH and the voltage levels of the voltages VoutH and VSW' are described by straight lines. However, a part of the voltage levels may be curves. Although the signals HP1 to HP6 and HN1 to HN4 look like simultaneously switching, the switching does not necessarily have to be performed simultaneously as long as the switching has no influence on the switching of the switching device MSWH. Exemplary modifications of the present embodiment can be variously mounted and performed. In the following, an exemplary modification of the present embodiment will be described.

Exemplary Modification

The current IoutH outputted by the electronic circuit 200 is in the relationship proportional to the current Iref generated by the reference current source 10. The electronic circuit 200 may acquire a value relating to the voltage at the drain terminal of the switching device MSWL, and the reference current source 10 may generate a current Iref based on the value relating to this voltage.

Figure 6:
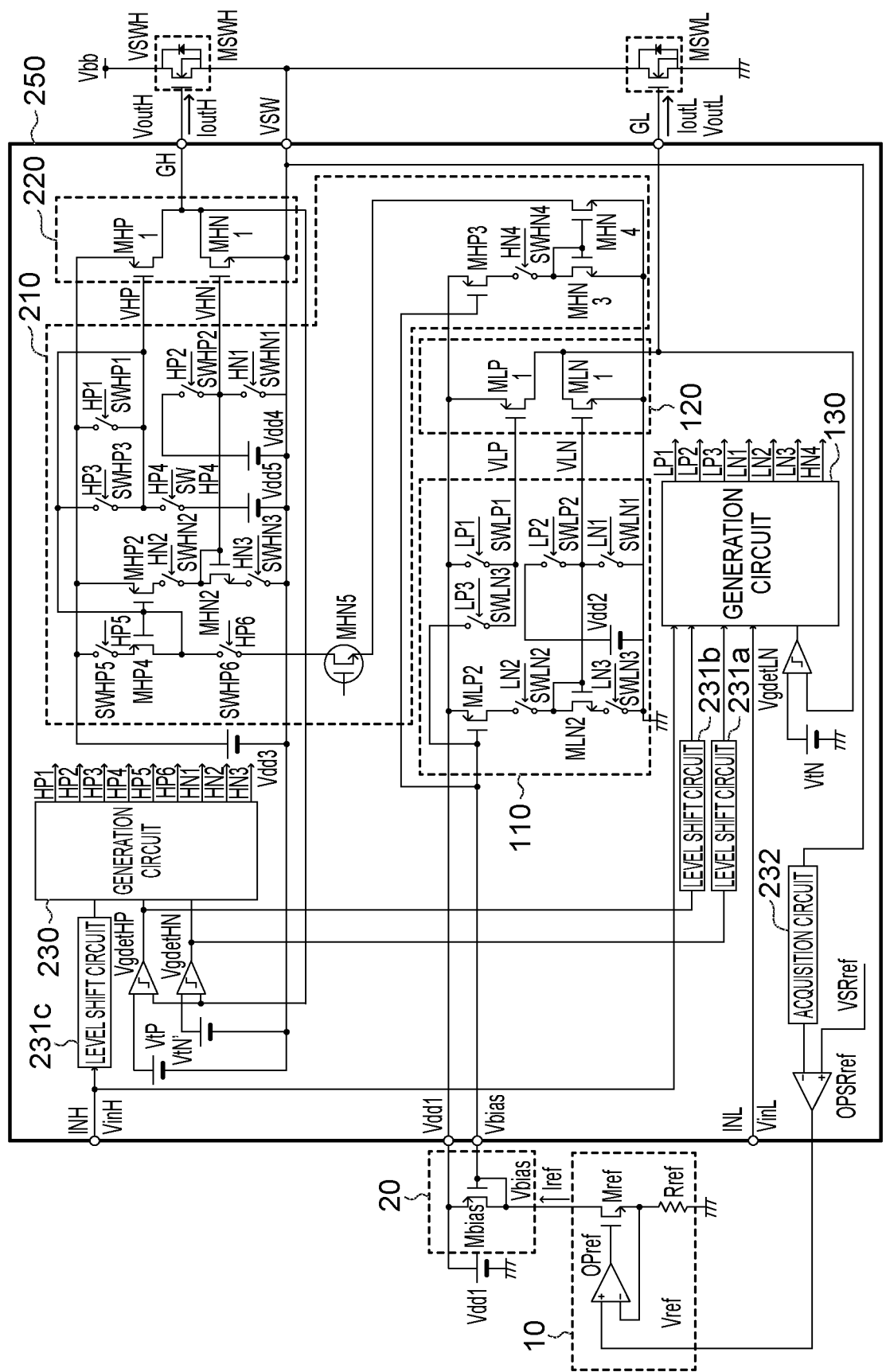
FIG. 6 is a drive system diagram including the configuration of an electronic circuit applicable to the second embodiment.

FIG. 6 shows an electronic circuit 250 further including an electronic circuit 200, an acquisition circuit 232, and an amplifier OPSRref. The acquisition circuit 232 is connected to the drain terminal of the switching device MSWL (the reference potential of the switching device MSWH) and to the inverting input terminal of the amplifier OPSRref. The non-inverting input terminal of the amplifier OPSRref is connected to a voltage source VSRref The voltage generated by the voltage source VSRref is a voltage VSRref. The output-side terminal of the amplifier OPSRref is connected to the non-inverting input terminal of the amplifier OPref of the reference current source 10.

The acquisition circuit 232 acquires a value relating to the voltage at the drain terminal of the switching device MSWL. The value relating to the voltage is, for example, the voltage (voltage VSW) at the drain terminal of the switching device MSWL, the time derivative value of the voltage VSW, or the like. The acquisition circuit 232 converts the value relating to this voltage into a voltage (or the voltage as it is), and sends the value to the amplifier OPSRref. The amplifier OPSRref amplifies the difference between the voltage indicating the value relating to the voltage sent from the acquisition circuit and the voltage VSRref, and sends the difference to the non-inverting input terminal of the amplifier OPref of the reference current source 10. The voltage VSRref is a voltage indicating the target value of the slew rate of the switching devices MSWL and MSWH. The voltage VSRref may be inputted from the outside of the electronic circuit 250.

In this manner, the reference current source 10 can generate a current Iref fed back to the target value of the slew rate of the switching devices MSWL and MSWH according to the switching of at least one of the switching devices MSWL and MSWH. The electronic circuit 250 can supply the output current IoutL proportional to the current Iref to the gate terminal of the switching device MSWL, and supply the output current IoutH to the gate terminal of the switching device MSWH. Thus, the switching of the switching devices MSWL and MSWH can be made more effective.

Figure 7:
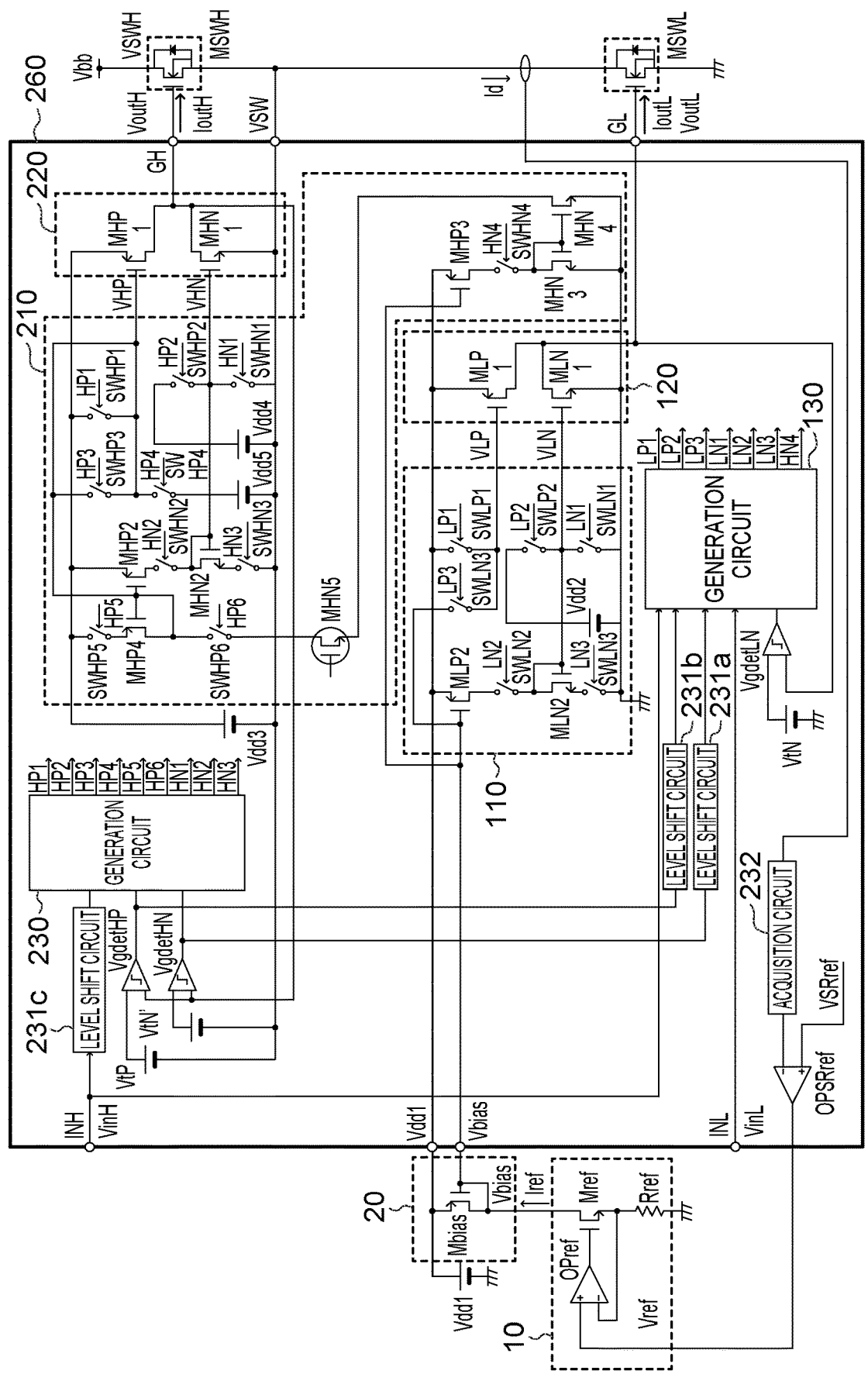
FIG. 7 is a drive system diagram including the configuration of an electronic circuit applicable to the second embodiment.

The acquisition circuit 232 may acquire a value relating to the current at the drain terminal of the switching device MSWL. The value relating to the current is, for example, the current at the drain terminal of the switching device MSWL, the time derivative value of this current, and the like. FIG. 7 shows an electronic circuit 260 in which the acquisition circuit 232 acquires a value relating to the current at the drain terminal of the switching device MSWL. The acquisition circuit 232 is the same as the electronic circuit 250 except the connection to the drain terminal of the switching device MSWL, and thus the description thereof will be omitted.

The acquisition circuit 232 acquires a value relating to the voltage at the drain terminal of the switching device MSWL, converts the value relating to this current into a voltage, and sends the value to the amplifier OPSRref. The amplifier OPSRref amplifies the difference between the voltage and the voltage VSRref, which represent the value relating to the current sent from the acquisition circuit, and sends the value to the positive input terminal of the amplifier OPref of the reference current source 10.

In this manner, similarly to the electronic circuit 250, the reference current source 10 can generate the current Iref fed back to the target value of the slew rate of the switching devices MSWL and MSWH corresponding to the switching of at least one of the switching devices MSWL and MSWH. Thus, the switching of the switching devices MSWL and MSWH can be made more effective.

It should be noted that a configuration may be provided in which FIG. 6 and FIG. 7 are combined, the acquisition circuit 232 acquires at least one of a value relating to the voltage and a value relating to the current at the drain terminal of the switching device MSWL, and the reference current source 10 generates the current Iref based on at least one of the value relating to the acquired voltage and the acquired current As described above, the exemplary modification of the present embodiment is described. The electronic circuit of the present embodiment switches a part of the control signal after the transition of the switching device MSWH in the switching of the switching device MSWH. Thus, the power consumption of the electronic circuit can be decreased while suppressing the influence on the switching of the switching device MSWH. The switching device MSWL and the switching device MSWH can be switched without increasing the reference current source and the I-V conversion circuit. Thus, the circuit scale of the drive system can be decreased, a reduction can be decreased, costs can be decreased, and power consumption can be decreased.

Third Embodiment

Figure 8:
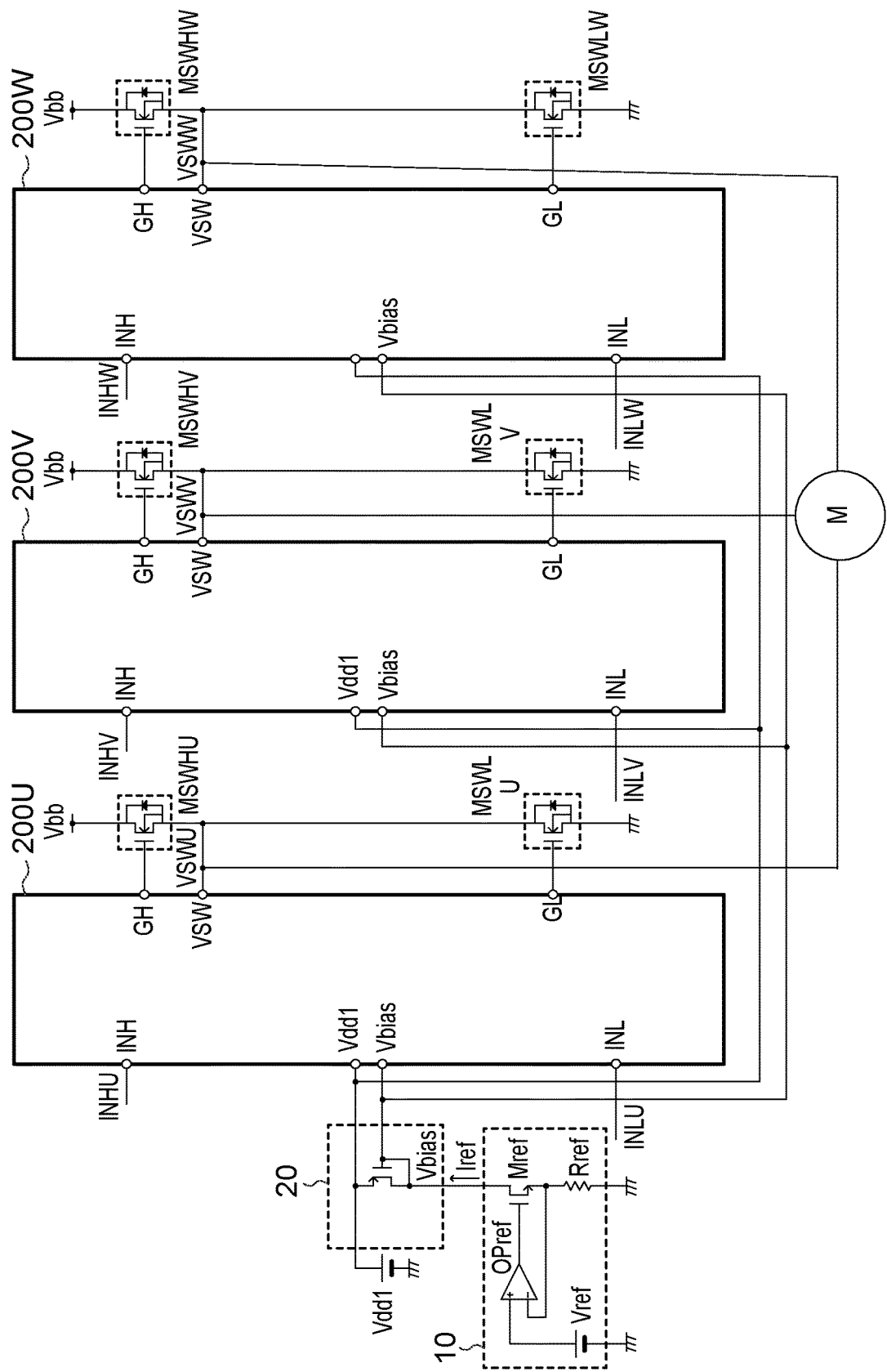
FIG. 8 is a drive system diagram according to the second embodiment.

FIG. 8 shows a drive system according to the present embodiment. This drive system is an inverter applied to a three-phase inverter by using three drive systems described in the second embodiment. This inverter includes switching devices MSWLU, MSWLW, MSWLV, MSWHU, MSWHV, and MSWHW, a reference current source 10, an I-V conversion circuit 20, and electronic circuits 200U, 200V, 200W.

The I-V conversion circuit 20 is connected to electronic circuits 200U, 200V, and 200W. The electronic circuit 200U is connected to the switching devices MSWLU and MSWHU. The electronic circuit 200V is connected to the switching devices MSWLV and MSWHV. The electronic circuit 200W is connected to the switching devices MSWLW and MSWHW. The switching node VSWU of the switching devices MSWLU and MSWHU, the switching node VSWV of the switching devices MSWLV and MSWHV, and the switching node VSWW of the switching devices MSWLW and MSWHW are connected to a load. In the present embodiment, for example, the inverter is connected to a motor M.

The electronic circuit 200U drives the switching device MSWLU and the switching device MSWHU, the electronic circuit 200V drives the switching device MSWLV and the switching device MSWHV, and the electronic circuit 200W drives the switching device MSWLW and the switching device MSWHW. The electronic circuits 200U, 200V, and 200W may be independently driven to the switching devices driven by the electronic circuits or may be driven depending on one switching device. The electronic circuits 200U, 200V, and 200W supply currents based on the current Iref generated by the reference current source 10 to the switching devices driven by the electronic circuits.

The switching devices MSWLU, MSWLV, MSWLW, MSWHU, MSWHV, and MSWHW are driven or not driven, and thus can drive the motor M. The individual operations of the reference current source 10, the I-V conversion circuit 20, and the electronic circuits 200U, 200V, and 200W are the same as those described in the first embodiment and the second embodiment, and thus the description thereof will be omitted. As the electronic circuits 200U, 200V, and 200W, the electronic circuits 250 and 260, which are modifications of the second embodiment, can be applied.

As described above, the present embodiment is described. In the drive system of the present embodiment, the current supplied to the gate terminal of each of the six switching devices constituting the three-phase inverter can be set by the current generated by one reference current source. This makes it easy to adjust the trade-off between EMI and switching loss in the switching device. The reference current source and the I-V conversion circuit can be shared by a plurality of electronic circuits. Thus, the circuit scale of the drive system can be decreased, a reduction can be decreased, costs can be decreased, and power consumption can be decreased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit, comprising:
a first circuit configured to generate a first current and output a first voltage, the first voltage being one of:
a voltage based on the first current, and
a first predetermined voltage;
a second circuit configured to generate a first output current based on the first voltage;
a first output terminal outputting the first output current to a first switching device;
a first input terminal having a first input signal inputted, the first input signal relating to driving and non-driving of the first switching device;
a third circuit configured to generate a first control signal based on the first input signal, the first control signal switching the first voltage to the first predetermined voltage and stopping the first current;
a fourth circuit configured to generate a second current; and
a fifth circuit configured to convert the second current into an input voltage, wherein
the first circuit is configured to generate the first current corresponding to the second current based on the input voltage.

2. The electronic circuit according to claim 1, further comprising
a first comparator configured to compare a voltage at the first output terminal with a second predetermined voltage, wherein
the third circuit is configured to generate the first control signal further based on a signal indicating a comparison result of a voltage at the first output terminal and the second predetermined voltage.

3. The electronic circuit according to claim 1, wherein
the third circuit is configured to generate the first control signal further based on a predetermined time relating to switching between driving and non-driving of the first switching device.

4. The electronic circuit according to claim 1, wherein
the first circuit outputs a second voltage to the second circuit, the second voltage being the input voltage or a third predetermined voltage
the second circuit is configured to generate the first output current based on the first voltage and the second voltage, and
the third circuit is configured to generate a second control signal based on the first input signal, the second control signal switching the second voltage to the input voltage or the third predetermined voltage.

5. The electronic circuit according to claim 1, wherein
the fourth circuit includes a fourth predetermined voltage source and a resistor, and
the second current is determined based on a voltage value of the fourth predetermined voltage source and a resistance value of the resistor.

6. The electronic circuit according to claim 1, further comprising an acquisition circuit configured to acquire at least one of a value relating to a voltage and a value relating to a current at a drain terminal of the first switching device, wherein
the fourth circuit is configured to generate the second current based on at least one of the value relating to the voltage acquired by the acquisition circuit and the value relating to the current.

7. The electronic circuit according to claim 1, further comprising:
a sixth circuit configured to generate a third current corresponding to the second current based on the input voltage and output a third voltage, the third voltage being one of a voltage based on the third current and a fifth predetermined voltage;
a seventh circuit configured to generate a second output current based on the third voltage;
a second output terminal configured to output the second output current to a second switching device having a source terminal electrically connected to a drain terminal of the first switching device;
a second input terminal having a second input signal inputted, the second input signal relating to driving and non-driving of the second switching device; and
an eighth circuit configured to generate a third control signal based on the second input signal, the third control signal switching the third voltage to the fifth predetermined voltage and stopping the third current.

8. The electronic circuit according to claim 7, further comprising
a second comparator configured to compare a voltage at the second output terminal with a sixth predetermined voltage, wherein
the eighth circuit is configured to generate the third control signal further based on a signal including a comparison result of the voltage at the second output terminal with the sixth predetermined voltage.

9. The electronic circuit according to claim 7, wherein
the eighth circuit is configured to generate the third control signal further based on a predetermined time relating to switching between driving and non-driving of the second switching device.

10. The electronic circuit according to claim 7, wherein
the sixth circuit is configured to generate a fourth current corresponding to the second current based on the input voltage and outputs a fourth voltage to the seventh circuit, the fourth voltage being a voltage based on the fourth current or a seventh predetermined voltage,
the seventh circuit is configured to generate the second output current based on the third voltage and the fourth voltage, and
the eighth circuit is configured to generate a fourth control signal based on the second input signal, the fourth control signal switching the fourth voltage to a voltage based on the fourth current or to the seventh predetermined voltage.

11. The electronic circuit according to claim 10, further comprising
a third comparator configured to compare voltage at the second output terminal with an eighth predetermined voltage, wherein
the eighth circuit is configured to generate the third control signal further based on a signal including a comparison result of the voltage at the second output terminal with the eighth predetermined voltage.

12. The electronic circuit according to claim 7, wherein the sixth circuit includes a high breakdown voltage transistor,
a reference potential of a circuit connected to a source terminal of the high breakdown voltage transistor is at a source potential of the first switching device, and
a reference potential of a circuit connected to a drain terminal of the high breakdown voltage transistor is at a source potential of the second switching device.

13. The electronic circuit according to claim 1, further comprising
the first switching device.

14. The electronic circuit according to claim 7, further comprising
the first switching device; and the second switching device.

15. An electronic apparatus comprising
a plurality of the electronic circuits according to claim 1.

* * * * *